(12) United States Patent
Fujiwara et al.

(10) Patent No.: US 8,087,918 B2
(45) Date of Patent: Jan. 3, 2012

(54) PRESSING MOLD AND METHOD FOR PRODUCING THE SAME

(75) Inventors: Hiroshi Fujiwara, Hiroshima (JP); Ichiro Kanba, Hiroshima (JP); Tadashi Takano, Hiroshima (JP)

(73) Assignee: Toyo Advanced Technologies Co., Ltd. (JP)

( * ) Notice: Subject to any disclaimer, the term of this patent is extended or adjusted under 35 U.S.C. 154(b) by 93 days.

(21) Appl. No.: 11/949,243

(22) Filed: Dec. 3, 2007

(65) Prior Publication Data

US 2008/0203272 A1    Aug. 28, 2008

(30) Foreign Application Priority Data

Feb. 27, 2007   (JP) .................................. 2007-046935

(51) Int. Cl.
*B29C 33/56* (2006.01)

(52) U.S. Cl. .......... 425/78; 425/355; 425/406; 425/410; 425/412

(58) Field of Classification Search .................. 425/78, 425/352–355, 406, 410, 412
See application file for complete search history.

(56) References Cited

U.S. PATENT DOCUMENTS

| | | | |
|---|---|---|---|
| 5,499,915 A * | 3/1996 | Fujita | 425/557 |
| 6,010,777 A * | 1/2000 | Ogimoto et al. | 264/668 |
| 6,517,339 B1 * | 2/2003 | Miya et al. | 425/542 |
| 6,576,162 B2 * | 6/2003 | Chiu et al. | 425/808 |
| 6,758,662 B2 * | 7/2004 | Sugaya et al. | 425/78 |
| 7,132,124 B2 * | 11/2006 | Matsumoto et al. | 427/135 |
| 7,241,492 B2 | 7/2007 | Kohara et al. | |
| 2006/0088621 A1 * | 4/2006 | Matsuoka et al. | 425/382 R |

FOREIGN PATENT DOCUMENTS

| | | | |
|---|---|---|---|
| CN | 86106364 | | 3/1988 |
| CN | 1651597 | | 8/2005 |
| JP | 05-050473 | * | 3/1993 |
| JP | 6017230 | | 1/1994 |
| JP | 6-145960 | | 5/1994 |
| JP | 8206755 | | 8/1996 |

OTHER PUBLICATIONS

Structure and Mechanical Properties of Ti (CxN1-x) Electric Arc Ion Plating.

* cited by examiner

*Primary Examiner* — Richard Crispino
*Assistant Examiner* — Thukhanh Nguyen
(74) *Attorney, Agent, or Firm* — Gerald E. Hespos; Michael J. Porco

(57) ABSTRACT

A pressing mold for use in press working of a material includes a mold body, a coating film formed on the portion of the pressing mold that comes into contact with the material in the press working, the coating film being formed by PVD method. The coating film includes a TiN layer formed on a surface of the mold body, a $Ti(C_xN_y)$ layer (wherein, $x+y=1$, $x<1$, and x gradually increases to 1 as it becomes more distant from the surface of the TiN layer) formed on the TiN layer, and a TiC layer formed on the $Ti(C_xN_y)$ layer.

6 Claims, 3 Drawing Sheets

PRESSING MOLD AND METHOD FOR PRODUCING THE SAME

BACKGROUND OF THE INVENTION

1. Field of the Invention

The present invention relates to a pressing mold which can be advantageously used for pressing a steel sheet having a high strength, such as a high tensile steel sheet or the like.

2. Description of the Related Art

In recent years, high tensile steel sheets are used for the purpose of improvement of safety and lightweight of a car body in the field of vehicle production.

A high tensile steel sheet, which has a high tensile strength and other mechanical strengths, requires higher pressing force in press working than conventionally used general press steel sheets. Therefore, in the press working of the high tensile steel sheet, the abrasion of the pressing mold is likely to rise due to the higher pressing force, which results in reduction of the lifetime of the mold.

To suppress the mold from being worn, there has been proposed a method of increasing the surface hardness of the mold by forming a hard coating film, such as coating film made of TiC (titanium carbide), TiCN (titanium carbonitride), on a surface of a mold body (see, for example, Japanese Patent Unexamined Publication No. HEI 6-145960).

As a method of forming a hard coating film, such as TiC coating film, there is known CVD (Chemical Vapor Deposition) method or PVD (Physical Vapor Deposition) method.

A coating film formed by CVD method is known to have a higher adherence than that formed by PVD method. Accordingly, CVD method is conventionally used to form a TiC coating film which has relatively low adherence with a mold body.

However, the coating film formation by CVD method requires a processing temperature of 1000° C. or greater, which causes a problem that the mold body is subjected to distortion or thermal deformation in the coating treatment. Consequently, a mold formed with a coating film by CVD method requires another operation of correcting the dimension of the mold after being formed with the coating film.

On the other hand, in the case of forming a coating film by PVD method, the temperature of the coating treatment does not need more than 500° C., which is lower than tempering of high speed steels or high tempering of dies steel. Consequently, the mold body is subjected to a relatively small distortion and thermal deformation. Thus, a mold formed with a coating film by PVD method has a favorable merit that no dimension correction is required after the coating treatment.

However, the TiC coating film formed by PVD method is liable to separate from the surface of the mold body because the adherence of the TiC coating layer is insufficient. Consequently, the durability of the mold is short. Among hard coating films formed by PVD method, further, a TiCN coating film is known to have a better adherence than the TiC coating film. However, the TiCN coating film is less resistant against abrasion due to a low slidability.

As a method of totally evaluating the quality of a coating film formed on a surface of a mold body, such as durability and slidability, an evaluation method using a bead drawing characteristic has been known, which will be described in detail in examples later.

A bead drawing characteristic is, as shown in FIG. 4, determined by placing a steel sheet between a male mold 30 and a female mold 31, moving the both molds 30 and 31 to each other to thereby press the steel sheet, drawing the steel sheet at a constant speed, measuring a pressing load P and a drawing load F when the steel sheet is broken off. The durability and slidability of a coating film formed on the mold surface can be calculated based on thus measured bead drawing characteristic. Specifically, a mold which provided a higher pressing load P and a higher drawing load F may be judged to be provided with a coating film having higher slidability and durability.

The conventional pressing molds provided with a hard coating film formed by PVD method have poor bead drawing characteristic.

SUMMARY OF THE INVENTION

It is an object of the present invention to provide a pressing mold which is excellent in the hardness, the adherence, the slidability, and the bead drawing characteristic of a coating film, and can provide high performance in the press working of various kinds of steel sheets, such as a high tensile steel sheet.

According to an aspect of the present invention, a pressing mold is used in press working of a material, and comprises: a mold body; and a coating film formed on the portion of the mold body that comes into contact with the material in the press working. The coating film is formed by Physical Vapor Deposition method, and includes: a TiN layer formed on a surface of the mold body; a Ti($C_xN_y$) layer formed on a surface of the TiN layer, wherein, x+y=1, x<1, and x gradually increases to 1 as it becomes more distant from the surface of the TiN layer; and a TiC layer formed on a surface of the Ti($C_xN_y$) layer.

With this construction, the coating film formed on the surface of the mold body is composed of the TiN layer on the surface of the mold body, the Ti($C_xN_y$) layer on the surface of the TiN layer, and the TiC layer on the surface of the Ti($C_xN_y$) layer. In the Ti($C_xN_y$) layer, the carbon concentration gradually increases as the layer progressing in an outward direction. The coating film has not only high hardness and adherence but also excellent slidability having high bead drawing characteristic, and thus the high durability.

In addition, since the coating film is formed by the PVD method, the pressing mold can be used without the necessity of any dimension correction after being formed, which results in lowering of production costs.

The above and other objects, features, aspects and advantages of the invention become more apparent when reading from the following detailed description in conjunction with the accompanying drawings.

DETAILED DESCRIPTION OF PREFERRED EMBODIMENT

Hereinafter, a preferred embodiment of the invention will be described in detail. It should be understood that the scope of the invention is not limited to the following embodiment.

Figure 1:
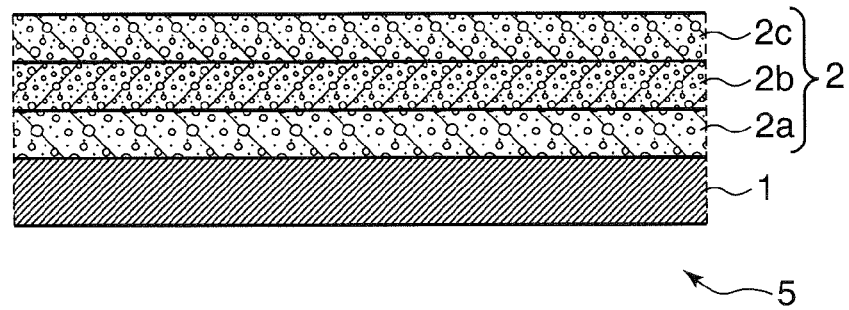
FIG. 1 is a sectional view showing a configuration of a part of a coating film formed on a surface of a mold body of a pressing mold according to an embodiment of the invention.

FIG. 1 is a sectional view showing a layer configuration of a coating film formed on a pressing mold according to an embodiment of the invention.

Referring to FIG. 1, a pressing mold 5 includes a mold body 1 and a coating film 2 formed on a surface of the mold body 1. The coating film 2 is hard and thin, and is formed by PVD method. The coating film 2 includes a TiN layer 2a formed on the surface of the mold body 1, a Ti($C_xN_y$) layer 2b (where, x+y=1, x<1, and x gradually increases to 1 as it becomes more distant from a surface of the TiN layer 2a) formed on the TiN layer 2a, and a TiC layer 2c formed on a surface of the Ti($C_xN_y$) layer 2b. In the pressing mold 5, the TiN layer 2a and the Ti($C_xN_y$) layer 2b are arranged between the mold body 1 and the TiC layer 2c. The adherence of the TiC layer 2c is greatly increased as compared to a TiC layer directly formed on a surface of the mold body 1. Accordingly, even if a TiC layer is arranged on an outermost of the pressing mold 5 by PVD method, the TiC layer can have the sufficient adherence.

The mold body 1 may be made not of a particular material, but of various kinds of materials that are conventionally used for a pressing mold, for example, dies steel such as SKD 11 and SKD 61, high speed steel such as SKH 51, tool steel such as SK 5 and SKS 3, super hard material, stainless steel such as SUS 440 C, SUS 420 J2, and SUS 304. Among these materials, dies steel such as SKD 11 or high speed steel such as SKH 51 may be preferably used because of having a high backup strength and hence excellent abrasion resistance.

The surface roughness Ra of the surface of the mold body 1, on which the coating film 2 is formed, may be preferably 0.1 µm or less. In this surface roughness range, the coating film 2 formed on the surface of the mold body 1 has excellent slidability. In the case of forming a coating film using PVD method, the formed coating film is likely to reflect a surface quality of the mold body. Accordingly, a better smooth surface of the mold body 1 makes a higher slidability of the coating film.

As described above, the coating film 2 includes the TiN layer 2a formed on the surface of the mold body 1, the Ti($C_xN_y$) layer 2b formed on the surface of the TiN layer 2a and the TiC layer 2c formed on the Ti($C_xN_y$) layer 2b. In the Ti($C_xN_y$) layer 2b, the carbon concentration increases as it becomes more distant from the surface of the TiN layer 2a.

The TiN layer 2a having a high adherence with the mold body 1 is formed on the surface of the mold body 1. The Ti($C_xN_y$) layer 2b, in which gradually substitute nitrogen atoms with carbon atoms and the carbon concentration thereby increases in an outward direction, is formed on the TiN layer 2a. The TiC layer 2c having a high hardness and slidability is formed on the surface of the Ti($C_xN_y$) layer 2b. Consequently, the coating film 2 has high hardness, high adherence, and excellent slidability or high bead drawing characteristic.

The thickness of the coating film 2 is not limited to a particular value, but may be preferably 5 µm or less, further preferably 4 µm or less to maintain the internal stress balance of the coating film 2 and assure the high adherence. The total thickness of the TiN layer 2a and the Ti($C_xN_y$) layer 2b is 2 to 4 µm, preferably 3 µm, to keep the adherence of the coating film 2 high. Also, the thickness of the TiC layer 2c is not particularly limited, but may be preferably 1 µm or greater. It is noted that there is an occasion that a boundary between these layers may not be definitely specified depending on a production condition and a coating film thickness.

The PVD method used in this embodiment is, for example, an ion plating method such as an arc ion plating method, a reactive sputtering method such as a magnetron sputtering method. Among these methods, the arc ion plating method is preferably used since it can form a coating film having high adherence even to a large pressing mold, which will be described in detail later.

A forming of a coating film by the arc ion plating method will be now described with reference to FIG. 2 which shows a construction of an arc vacuum coating film forming apparatus that is used in the arc ion plating method.

Figure 2:
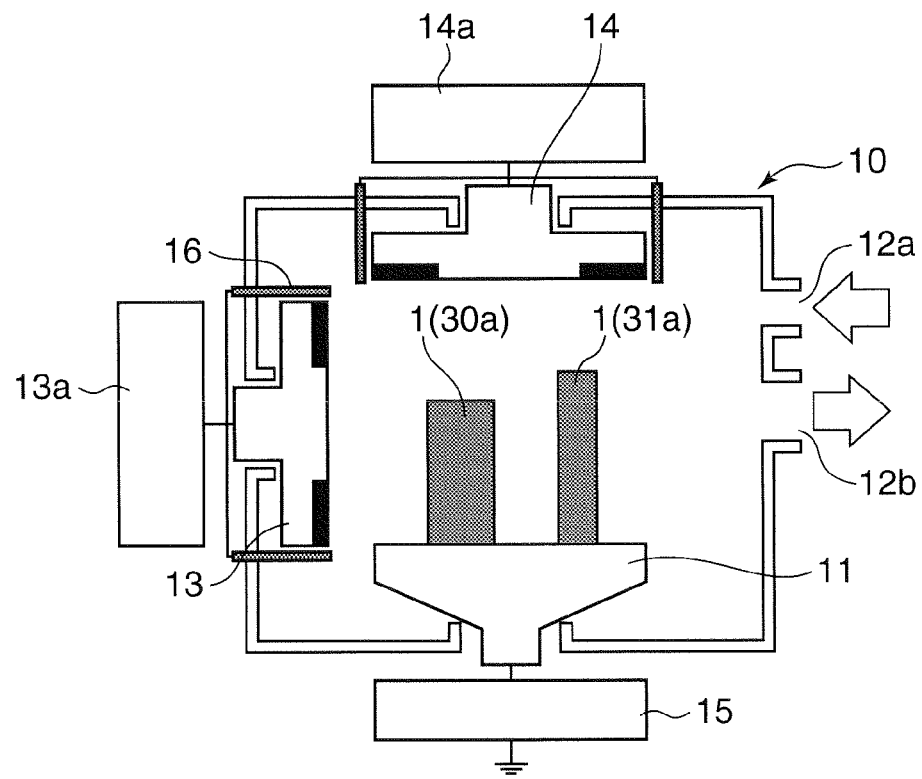
FIG. 2 is a schematic diagram showing a construction of an ion plating apparatus used in the embodiment.

In FIG. 2, reference numerals 10, 11, 12a, 12b, 13 (and 14), 13a (and 14a), 15, and 16 denote a vacuum chamber, a rotary table, a gas inlet, a gas outlet, a titanium evaporating source, an arc power source, a bias power source, and an anode, respectively.

First, the mold body 1 is placed on the rotary table 11 in the vacuum chamber 10. Next, the internal temperature of the vacuum chamber 10 is raised to 250 to 550° C., its internal pressure is reduced to $10^{-2}$ to $10^{-3}$ Pa, and then, argon (Ar) gas is introduced into the vacuum chamber 10 through the gas inlet 12a. The mold body 1 is preferably heated up to 400 to 500° C. to enhance the adherence of the coating film. The surface of the mold body 1 is activated by colliding Ar ions with the mold body 1 under an application of a bias voltage to the mold body 1.

Next, the arc power sources 13a and 14a generate arc discharge and vaporize titanium from the titanium evaporating sources 13 and 14. At the same time, for example, nitrogen gas is introduced as a nitrogen source into the chamber 10 through the gas inlet 12a. Then, nitrogen and titanium are ionized in a plasma generated by the arc discharge, and the ionized nitrogen and titanium are accelerated by the bias voltage. The accelerated and ionized nitrogen and titanium are adhered to the surface of the mold body 1 to form a TiN layer. Next, hydrocarbon gas is introduced into the chamber 10 as a carbon source through the gas inlet 12a to form a TiCN layer. At this time, the supply of the nitrogen gas is gradually reduced while the supply of the hydrocarbon gas is increased. Finally, the supply of the nitrogen gas is stopped and only the hydrocarbon gas is supplied. In this way, as a raw material gas introduced in the chamber 10, a quantity of nitrogen gas is supplied at an initial stage, the nitrogen gas is gradually substituted with the hydrocarbon gas to form the TiN layer on the surface of the mold body 1, the amount of nitrogen in the TiN layer is gradually reduced while the amount of carbon in the TiN is increased to form a Ti($C_xN_y$) layer, and finally, a TiC layer is formed on the surface of the Ti($C_xN_y$) layer. In this manner, by forming the TiN layer with high adherence on the surface of the mold body 1, gradually changing the composition of the TiN layer in a thickness direction to substitute nitrogen with carbon, and forming the TiC layer with excellent slidability and abrasion resistance on the Ti($C_xN_y$) layer, it is possible to form a hard coating film with superior durability on the surface of the mold body.

Surface hardness (Vickers hardness) of the pressing mold having the coating film formed thereon is preferably 3000 to 4000 HV from a standpoint of abrasion resistance of the coating film.

The pressing mold having the coating film formed on the surface thereof has the superior bead drawing characteristic. Accordingly, such a pressing mold can be advantageously used for press working of various kinds of steel sheets such as a high tensile steel sheet and so on.

Hereinafter, the invention will be described in more detail with reference to an example, but it should be understood that the scope of the invention is not limited to such an example.

INVENTIVE EXAMPLE

Figure 3:
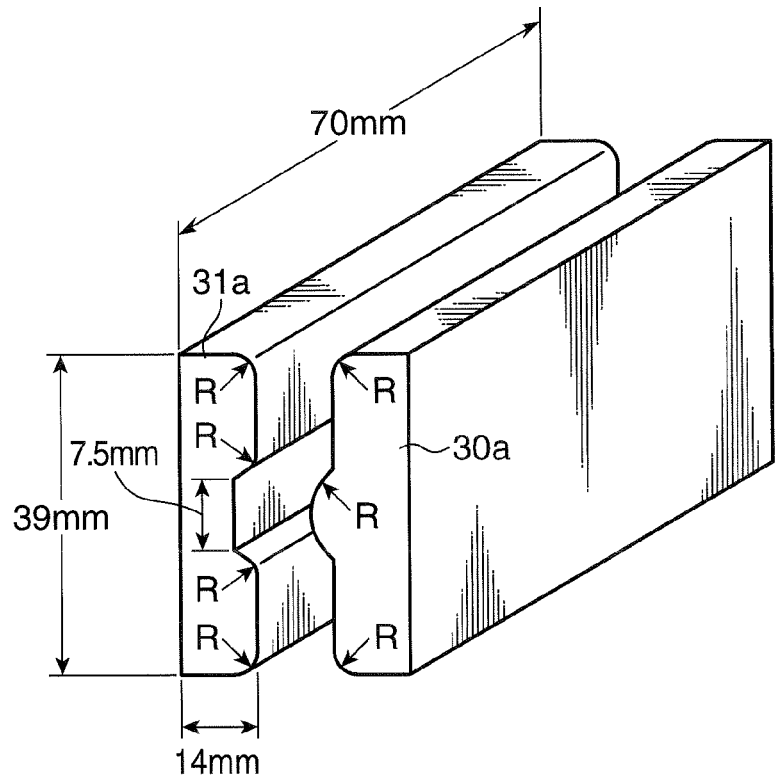
FIG. 3 is a perspective view of pressing molds used in a bead drawing characteristic measurement.

First, a set of male mold body 30a and female mold body 31a, which are made of SKD 11 and have a shape and a dimension as shown in FIG. 3 and mirror-finished surfaces with Ra=0.05 μm or so, was prepared.

Coating films were formed on a surface of each of the male mold body 30a and the female mold body 31a using the arc vacuum coating film forming apparatus that employs the arc ion plating method.

For the formation of the coating film, first, the male mold body 30a and the female mold body 31a were placed on the rotary table 11. Then, the internal pressure of the vacuum chamber 10 was reduced to $3 \times 10^{-3}$ Pa. The temperature of the male mold body 30a and the female mold body 31a was set to be 450° C. using a heater (not shown). Next, the internal pressure of the vacuum chamber 10 was held at 2.7 Pa by supplying an Ar gas through the gas inlet 12a while discharging the Ar gas through the gas outlet 12b.

Next, the supply of the Ar gas was stopped, and then, nitrogen gas was supplied at a flow rate of 300 Ml/min for 7 minutes. At this time, the internal pressure of the vacuum chamber 10 was also held at 2.7 Pa. At the same time, the titanium evaporating sources 13 and 14 were arc-discharged to vaporize titanium. Nitrogen and titanium were ionized in a plasma generated by the arc discharge, and the ionized nitrogen and titanium was accelerated by bias voltages applied to the male mold body 30a and the female mold body 31a, thereby forming TiN coating films on the surfaces of the materials 30a and 31a, respectively.

Next, while the amount of supply of nitrogen gas was gradually decreased, the amount of supply of methane gas was increased for 20 minutes with the internal pressure kept at 2.7 Pa. Finally, the supply of the nitrogen gas was stopped, and only methane gas was supplied for 20 minutes.

In this manner, on the surface of each of the male mold body 30a and the female mold body 31a was formed a TiN layer of about 1 μm, a Ti($C_xN_y$) layer of about 2 μm, and a TiC layer of about 1 μm in order.

Figure 5:
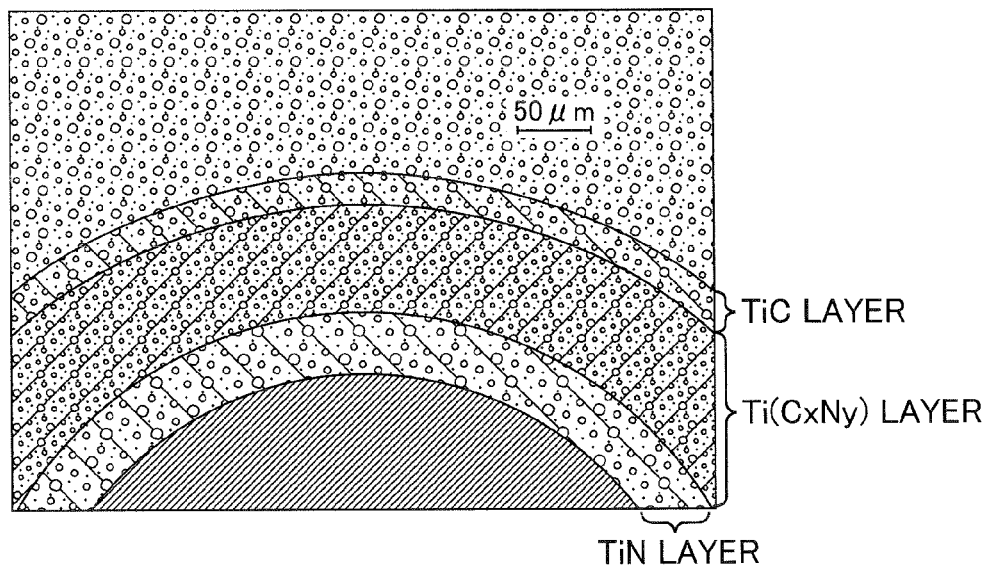
FIG. 5 shows a microscopic photograph of a coating film formed on a surface of a pressing mold obtained in an inventive example.

The thickness of the formed layers was measured by measuring and calculating a length of a predetermined portion of a polishing mark produced by a ball tester using an optical microscope and a precision coating film thickness gauge (Calotest; simple, precision coating film thickness gauge available from CSEM Co., Ltd.). FIG. 5 shows a microscopic photograph obtained at this time.

Micro-Vickers hardness, adherence and bead drawing characteristic of the surface of each of the male mold body 30a and the female mold body 31a having the coating film formed so thereon was evaluated. The adherence was evaluated with scratch measurement values obtained by a scratch tester (REVETEST; automatic scratch tester available from CSEM Co., Ltd.). The bead drawing characteristic was evaluated according to the following method.

Bead Drawing Characteristic

Figure 4:
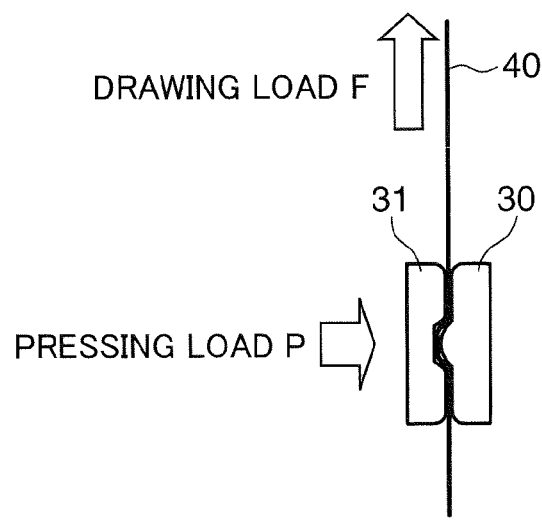
FIG. 4 is a schematic diagram showing a bead drawing characteristic measurement.

As shown in FIG. 4, a steel sheet 40 made of a 20×300×1.4 mm high tensile steel material CR980Y (100 k HighTen) was inserted between the male mold 30 and the female mold 31, both of which had the coating films formed thereon. Then, a pressing mold composed of the male mold 30 and the female mold 31 with the steel sheet 40 interposed therebetween was set on a fixed small presser. Then, while gradually pressing the male mold 30 and the female mold 31 using the small presser, one end of the steel sheet 40 interposed therebetween was pulled at a constant speed (500 mm/min). A drawing load F and a pressing load P of the small presser when the steel sheet 40 was broken off were measured.

In addition, a friction coefficient was measured according to an Equation of "Friction coefficient μ=drawing load F/pressing load P" from the drawing loads F and pressing loads P in the initial state of the drawing and at the broken-off of the steel sheet 40.

Table 1 shows results of the measurements.

COMPARATIVE EXAMPLE

In the above-mentioned example, the supply of Ar gas was stopped, and then, only nitrogen gas was supplied for 15 minutes with the internal pressure kept at 2.7 Pa. Thereafter, a flow rate of methane gas was linearly increased such that a ratio of flow rate of the nitrogen gas to flow rate of methane gas became 1:1 in 90 minutes. During this period of time, the internal pressure was kept at 2.7 Pa. Thereafter, the flow rate of methane gas was linearly increased such that the ratio of flow rate of nitrogen gas to flow rate of methane gas comes into 1:2 and the internal pressure comes into 1.3 Pa in 10 minutes, and then nitrogen gas and methane gas continued to be supplied for 10 minutes under the same conditions. In the above processes, the titanium evaporating sources 13 and 14 were arc-discharged to vaporize titanium at the same time. Nitrogen, carbon and titanium were ionized in a plasma generated by the arc discharge, and the ionized nitrogen and titanium were accelerated by bias voltages applied to the male mold body 30a and the female mold body 31a, thereby forming a Ti($C_xN_y$) layer on an outermost surface of each of mold bodies 30a and 31a.

Figure 6:
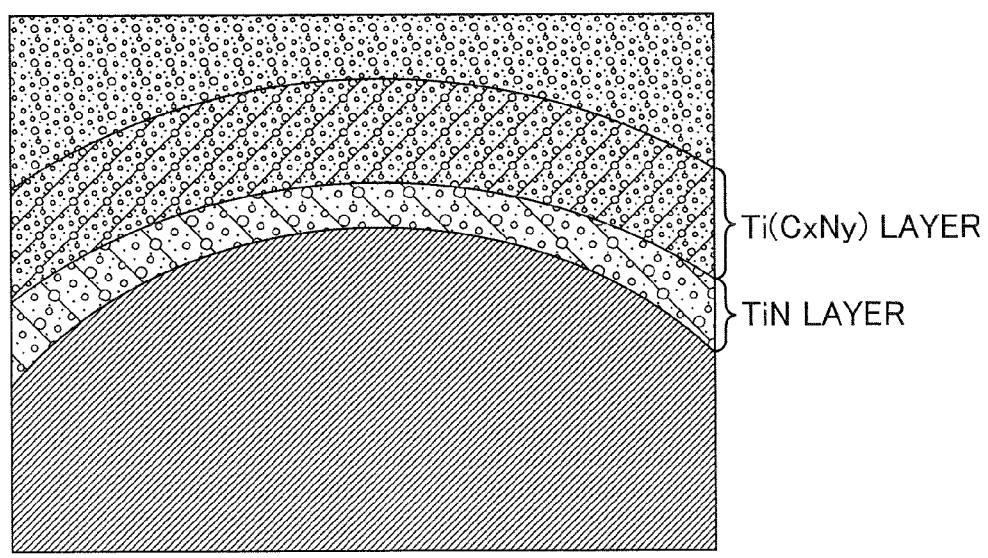
FIG. 6 shows a microscopic photograph of a coating film formed on a surface of a pressing mold obtained in a comparative example.

In this manner, a coating film which has a thickness of about 4 μm and the TiN layer and the Ti($C_xN_y$) layer was formed on the surface of each of the male mold body 30a and the female mold body 31a. FIG. 6 shows a microscopic photograph of ball tester polishing marks of the formed coating films.

Micro-Vickers hardness, adherence and bead drawing characteristic of the formed coating film were measured. Table 1 shows results of the measurement.

TABLE 1

|  |  | Inventive Example | Comparative Example |
|---|---|---|---|
| Micro-Vickers Hardness (Hv, 0.49N Load) | | 3709 | 2070 |
| Adherence against Scratch (N) | | 54.5 | 29.3 |
| Bead Drawing Characteristic | Pressing Load (kN) | 23 | 6 |
| | Drawing Load (kN) | 30 | 26 |
| | Friction Coefficient in Initial Stage | 0.22 | 0.27 |
| | Friction Coefficient at Broken Off | 0.38 | 0.45 |

The micro-Vickers hardness of the pressing mold of the comparative example which is formed with the coating film with the Ti($C_xN_y$) layer on the outermost thereof by PVD method is 2070 Hv. The micro-Vickers hardness of the pressing mold of the inventive example is 3709 Hv. It will be seen that the coating film formed of the inventive example has more hardness than that of the comparative example. Further, the adherence of the coating film of the comparative example is 29.3 N in the scratch test. The adherence of the coating film of the inventive example is 54.5 N. This shows that the coating film of the inventive example has greater adherence than that of the comparative example.

In the bead drawing characteristic evaluation, moreover, the drawing load of the coating film of the comparative example is 26 kN. The drawing load of the coating film of the inventive example is 30 kN. The pressing load of the coating film of the comparative example is 6 kN. The pressing load of the coating film of the inventive example is 23 kN. It will be seen that the coating film of the inventive example has superior bead drawing characteristic comparing to the comparative example. Furthermore, the coating film of the inventive example has a lower friction coefficient both in the initial stage of drawing and at the broken-off than that of the comparative example, and thus has the slidability superior to that of the comparative example.

This application is based on patent application No. 2007-046935 filed in Japan, the contents of which are hereby incorporated by references.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds are therefore intended to embraced by the claims.

What is claimed is:

1. A pressing mold for use in press working of a material, consisting of:
    a mold body; and
    a coating film formed on the portion of the mold body that comes into contact with the material in the press working, the coating film being formed by a Physical Vapor Deposition method, the coating film consisting of:
    a TiN layer directly formed on a surface of the mold body;
    a $Ti(C_xN_y)$ layer formed on a surface of the TiN layer, wherein, x+y=1, 0<x<1, and x gradually increases from zero to 1 as the $Ti(C_xN_y)$ becomes more distant from the surface of the TiN layer in a thickness direction; and
    a TiC layer formed on a surface of the $Ti(C_xN_y)$ layer
    wherein the thickness of the coating film is 5 μm or less, surface roughness Ra of the surface of the mold body, on which the coating film is formed, is approximately 0.05 μm and surface hardness (Vickers hardness) of the pressing mold having the coating film is 3000 to 4000 HV.

2. The pressing mold according to claim 1, wherein the Physical Vapor Deposition method is an arc ion plating method.

3. The pressing mold according to claim 1, wherein the thickness of the TiN layer is 1 μm or more, the thickness of the $Ti(C_xN_y)$ layer is 1 to 3 μm, and the thickness of the TiC layer is 1 μm or more.

4. A pressing mold for use in press working of a material, consisting of:
    a mold body; and
    a coating film formed on the portion of the mold body that comes into contact with the material in the press working, the coating film being formed by a Physical Vapor Deposition method, the coating film consisting of:
    a TiN layer directly formed on a surface of the mold body;
    a $Ti(C_xN_y)$ layer formed on a surface of the TiN layer, wherein, x+y=1, 0 <x <1, and x increases sequentially from zero to 1 as the $Ti(C_xN_y)$ becomes more distant from the surface of the TiN layer in a thickness direction; and
    a TiC layer formed on a surface of the $Ti(C_xN_y)$ layer
    wherein the thickness of the coating film is 5 μmor less, surface roughness Ra of the surface of the mold body, on which the coating film is formed, is approximately 0.05 μm and surface hardness (Vickers hardness) of the pressing mold having the coating film is 3000 to 4000 HV.

5. The pressing mold according to claim 4, wherein the Physical Vapor Deposition method is an arc ion plating method.

6. The pressing mold according to claim 4, wherein the thickness of the TiN layer is 1 μm or more, the thickness of the $Ti(C_xN_y)$ layer is 1 to 3 μm, and the thickness of the TiC layer is 1 μm or more.

* * * * *